United States Patent
Lin et al.

(10) Patent No.: US 8,823,166 B2
(45) Date of Patent: Sep. 2, 2014

(54) PILLAR BUMPS AND PROCESS FOR MAKING SAME

(75) Inventors: Cheng-Chung Lin, Taipei (TW); Chung-Shi Liu, Shin-Chu (TW); Meng-Wei Chou, Zhubei (TW); Kuo Cheng Lin, Hsin-Chu (TW); Wen-Hsiung Lu, Jhonghe (TW); Chien Ling Hwang, Hsin-Chu (TW); Ying-Jui Huang, Taipei (TW); De-Yuan Lu, Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 183 days.

(21) Appl. No.: 12/871,565

(22) Filed: Aug. 30, 2010

(65) Prior Publication Data

US 2012/0049346 A1 Mar. 1, 2012

(51) Int. Cl.
*H01L 23/48* (2006.01)
*H01L 23/52* (2006.01)
*H01L 29/40* (2006.01)

(52) U.S. Cl.
USPC ........... 257/737; 257/778; 257/779; 257/780; 257/E23.021; 257/E21.508

(58) Field of Classification Search
CPC .............................. H01L 24/11; H01L 24/13
USPC .................. 257/737, 778, 779, 780, E23.021, 257/E21.508
See application file for complete search history.

(56) References Cited

U.S. PATENT DOCUMENTS

| | | | |
|---|---|---|---|
| 5,251,806 A * | 10/1993 | Agarwala et al. | 228/180.22 |
| 5,773,897 A * | 6/1998 | Wen et al. | 257/778 |
| 6,592,019 B2 * | 7/2003 | Tung | 228/197 |
| 2001/0002068 A1 * | 5/2001 | Farnworth et al. | 257/737 |
| 2002/0033412 A1 * | 3/2002 | Tung | 228/215 |
| 2005/0127508 A1 | 6/2005 | Lee et al. | |
| 2006/0051954 A1 * | 3/2006 | Lin et al. | 438/614 |
| 2006/0087034 A1 * | 4/2006 | Huang et al. | 257/737 |
| 2006/0166402 A1 * | 7/2006 | Lim et al. | 438/108 |
| 2006/0223313 A1 | 10/2006 | Yoon et al. | |
| 2006/0292711 A1 * | 12/2006 | Su et al. | 438/14 |
| 2009/0096092 A1 * | 4/2009 | Patel | 257/737 |
| 2009/0233436 A1 | 9/2009 | Kim et al. | |
| 2010/0019347 A1 * | 1/2010 | McLellan et al. | 257/532 |
| 2010/0164109 A1 * | 7/2010 | Chiou et al. | 257/754 |
| 2010/0193970 A1 * | 8/2010 | Damberg et al. | 257/778 |
| 2012/0007228 A1 * | 1/2012 | Lu et al. | 257/692 |
| 2012/0040524 A1 * | 2/2012 | Kuo et al. | 438/614 |

FOREIGN PATENT DOCUMENTS

| | | |
|---|---|---|
| CN | 1873939 A | 12/2006 |
| JP | H02253628 A | 10/1990 |

\* cited by examiner

*Primary Examiner* — Teresa M Arroyo
(74) *Attorney, Agent, or Firm* — Slater and Matsil, L.L.P.

(57) ABSTRACT

Apparatus and methods for providing solder pillar bumps. Pillar bump connections are formed on input/output terminals for integrated circuits by forming a pillar of conductive material using plating of a conductive material over terminals of an integrated circuit. A base portion of the pillar bump has a greater width than an upper portion. A cross-section of the base portion of the pillar bump may make a trapezoidal, rectangular or sloping shape. Solder material may be formed on the top surface of the pillar. The resulting solder pillar bumps form fine pitch package solder connections that are more reliable than those of the prior art.

10 Claims, 4 Drawing Sheets

| NORMALIZED STRESS \ CASE | CONVENTIONAL | FIGURE 1 | FIGURE 6 | FIGURE 7 |
|---|---|---|---|---|
| ELK REFLOW 25 DEGREES C | 1.00 | 0.91 | 0.90 | 0.86 |
| UBM REFLOW 25 DEGREES C | 1.00 | 0.92 | 0.91 | 0.89 |
| PASSIVATION REFLOW 25 DEGREES C | 1.00 | 1.05 | 1.06 | 1.24 |
| BUMP TCT 125 DEGREES C | 1.00 | 1.18 | 1.20 | 1.32 |
| PRE SOLDER TCT 125 DEGREES C | 1.00 | 0.96 | 0.96 | 0.89 |
| UF TCT -55 DEGREES C | 1.00 | 0.94 | 0.97 | 1.16 |

PILLAR BUMPS AND PROCESS FOR MAKING SAME

BACKGROUND

A current common requirement for an advanced electronic circuit and particularly for circuits manufactured as integrated circuits ("ICs") in semiconductor processes is the use of a pillar or column over an integrated circuit terminal to form a column or pillar solder bump or solder column connections. In a traditional "flip chip" approach to packaging and interconnections, solder bumps are used to couple the external terminals of a monolithic integrated circuit (which may be a silicon substrate with active or passive circuit elements and connections formed upon it, or other semiconductor substrate materials including gallium arsenide (GaAs), silicon on insulator (SOI), and silicon germanium (SiGe)) to a package substrate or circuit board. Sometimes an interposer is also incorporated and the integrated circuit is mounted to the interposer, which in turn is mounted to the circuit board or package substrate. As is known in the art, interposers may be used to provide improved thermal matching to the die and stress relief These integrated circuit devices may have tens or hundreds of input and output terminals for receiving and sending signals and/or for coupling to power supply connections. In some IC designs, the terminals are placed at the periphery of the integrated circuit and away from the active circuitry. In more advanced and complex integrated circuits, the terminals may be placed over the active area and lie over the active devices within the integrated circuit. In memory integrated circuits, sometimes a center pad arrangement is used.

In a "flip chip" application, the integrated circuit (IC) is mounted face down (flipped) with respect to the substrate. Terminal openings are formed in a protective insulating layer overlying the wafer including the integrated circuit, called a passivation layer, which overlies the face of the integrated circuit device. Conductive input/output terminals of the integrated circuit are exposed in these openings. Solder (including lead free solder material) bumps; solder columns or solder balls are placed on these terminals. The solder bumps may be formed as hemispherical shapes or columns of conductive material extending away from the surface of the integrated circuit. The solder bumps or columns are then used to form the external connections to the integrated circuit. The solder bumps may be provided already formed on the completed integrated circuit using a "wafer scale" or wafer level process approach, or the solder connectors may be added later after the wafers are singulated into individual integrated circuit devices called "dice". Presently, wafer level bumping operations are increasingly preferred.

In any case, a thermal solder reflow process is typically used to cause the solder bumps to melt and then reflow to complete the mechanical and electrical connection between the flip chip integrated circuit and a substrate. The substrate may be resin or epoxy, a laminated board, film, printed circuit board or even another silicon device. In thermal reflow, the solder bumps, solder balls, or solder columns, which may be lead based or lead free solder, melt and then cool to form a permanent mechanical, and electrically conductive, connection between the terminals of the integrated circuit and the substrate. The combined flip chip IC and substrate may then be packaged as a single integrated circuit. Typically, these flip chip packages are completed as ball grid array or pin grid array packages. Alternatively, in a multiple chip module form, the flip chip may be combined with other integrated circuits which may also be "flip chips", or wire bond connections may be used. For example, sometimes memory devices such as FLASH nonvolatile devices, and processors that would use the FLASH device for program or data storage, are combined in a single packaged device. IC devices may be stacked vertically or placed alongside one another using a larger substrate, interposer or circuit board.

In current wafer level processing, the wafer is typically bumped using wafer scale processes. The wafer is processed as a unit at least until the solder bumps are completely formed on each device on the wafer, and then a singulation process may be performed to separate the integrated circuits as individual dice or dies. The bumped dies are individually processed after that. In a flip chip application, the dies are flipped over to face a package substrate or interposer, and the solder bumps are aligned with solder pads on the substrate, a thermal reflow process completes the assembly by causing the solder bumps to melt and make an electrical and mechanical connection between terminals on the die and the terminals on the substrate. The assembly process often includes adding an underfill ("UF") material after reflow, to further protect the solder connections during thermal cycles that are expected in use of the device.

As the industry advances wafer level processing (WLP) further, the package steps performed at the wafer level are increasing so that the number of steps to be performed on individual dice is decreasing; however, a variety of different wafer level and die process level steps are currently in use.

Recently, the semiconductor industry has been moving to "lead (Pb) free" packaging and lead-free device connector technology. This trend increasingly results in the use of lead free solder bumps and lead free solder balls to form connections with integrated circuits and packages. These lead free solder materials are formed of tin and tin alloys which may include, for example, silver, nickel, copper and other metals. The lead-free composition is a eutectic, that is, the materials in it have a common melting point. The use of lead free solder is safer for the environment, safer for workers in the industry and safer for consumers than lead based solder bumps or solder balls. However, the quality and reliability of the final solder connections formed has not always been as great as desired.

In addition, as device sizes continue to fall, the pitch between the terminals on the integrated circuits is also decreasing. Bridging between adjacent bumps may cause electrical shorts, for example. Also, the solder bumps are subject to mechanical deformation so that the bump heights in a completed flip chip substrate assembly may be non-uniform and the bumps may, after remelting and reflow processing, end up with unequal distances between them. Further, the use of underfills ("UF") with solder bumps in certain fine pitch devices can leave voids in the UF materials, creating additional problems such as cracking and hot spots, etc.

A solution for finer pitch devices is to use, instead of solder bumps, copper or other conductive pillars with a solder (typically a lead free solder) cap. In addition to copper (Cu), other conductive materials such as nickel (Ni), gold (Au), palladium (Pd) and the like may be used, and alloys of these metals may also be used. These pillars form a connector type referred to as "copper pillar bumps". Copper pillar bumps may also include copper alloys and other copper containing conductors, or the pillar bumps may be formed of other conductive materials. An advantage of these pillar bumps is that the pillars do not completely deform during reflow. While the solder cap forms a spherical tip that does melt during thermal reflow, the columnar pillar tends to maintain its shape. The copper pillars are more conductive thermally than the solder bumps used previously, enhancing heat transfer. The narrow pillars may then be used in a finer pitch array than previously possible with solder bumps, without bridging shorts, and other problems such as non-uniform bump height. As the size of the integrated circuit devices continues to shrink, the pitch between the terminals and the corresponding pitch between pillar bumps will also continue to decrease. The problems associated with the thermal stresses observed using pillar bumps may be expected to increase with continued reduction in the pitch between terminals.

BRIEF DESCRIPTION OF THE FIGURES

For a more complete understanding of the present disclosure, and the advantages thereof, reference is now made to the following descriptions taken in conjunction with the accompanying drawings, in which.

The drawings, schematics and diagrams are illustrative and not intended to be limiting, but are examples of embodiments of the disclosure, are simplified for explanatory purposes, and are not drawn to scale.

DETAILED DESCRIPTION OF ILLUSTRATIVE EMBODIMENTS

The making and using of the embodiments are discussed in detail below. It should be appreciated, however, that the present disclosure provides many applicable inventive concepts that can be embodied in a wide variety of specific contexts. The specific embodiments discussed are merely illustrative of specific ways to make and use the disclosure, and do not limit the scope of the disclosure.

Embodiments of the present disclosure which are now described in detail provide novel methods and apparatus to reduce the thermal stresses in packaged integrated circuits using copper pillar bumps by changing the shape of the copper pillars to reduce or eliminate the problems with thermal stresses in the materials observed in the conventional pillar bump arrangements used previously.

Figure 1:
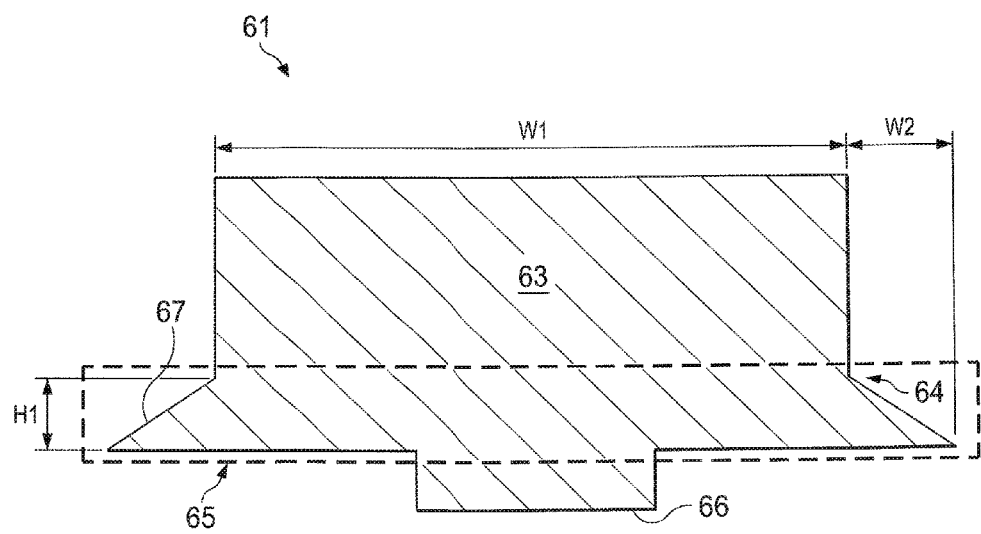
FIG. 1 depicts in a cross-sectional view an embodiment pillar bump of the disclosure.

FIG. 1 illustrates in a cross-sectional view a first embodiment of a pillar shape 61 of the present disclosure. It should be noted that in this example and throughout the specification, cross sectional views are shown illustrating embodiments of the pillars; however, the pillars are annular in shape. Also, the words "vertical" and "rectangular" as used throughout the specification are used broadly enough to encompass substantially vertical and substantially rectangular features formed within the boundaries of semiconductor manufacturing processes.

An upper columnar portion 63 of the pillar 61 is formed over a wider base portion shown within the dashed area in the figure and numbered 65. The sloped exterior surface 67 of the base portion 65 slopes from the bottom of the wider base portion 65 upwardly towards the upper columnar portion 63. The exterior surface 67 of the base portion 65 intersects the vertical side of the upper columnar portion 63 at area 64 at an angle greater than 90 degrees. A cross-section of the base portion 65 is a trapezoidally shaped structure. A bottom rectangular portion 66 lies beneath the trapezoidally shaped base 65. This bottom portion 66 extends downwardly to the terminal on the integrated circuit, (not shown).

Studies of the thermal stresses placed on various materials in a completed assembled integrated circuit using this embodiment shape for the pillars have shown that for most of the layers, such as extreme low k dielectric ("ELK"), under bump metallization ("UBM"), underfill ("UF"), pre-solder and the solder bumps, the thermal stresses observed when using an embodiment of the disclosure such as the one in FIG. 1 are lower than those obtained by use of the conventional column pillar shape of the prior art.

In FIG. 1, the embodiment 61 may be, for example, a pillar having a width W1 for the upper portion 63 of approximately 85 microns. Base portion 65 forms a trapezoid in cross-section. The base portion 65 is wider than the columnar upper portion 63 by a small amount. In this illustrative and non-limiting example, the base has an extension that is a width W2 wider on each side of the cross section than the columnar portion above it. In one example W2 is 5 microns so that for this illustrative example, the base 65 is 95 microns wide. Thus the base portion is a width approximately 10% greater than the width of the upper portion; the base portion width may be more or less than 10% greater. Further, the height of the base portion 65 may also be fairly small as compared to the height of the upper portion; in this example, the height H1 is 3 microns. The exterior sloped surface 67 of the extended base portions slopes from the widest portion of the base portion 65 upwardly towards the columnar upper portion 63 and intersects the vertical sidewall at an angled portion 64, having an intersect angle greater than 90 degrees. The height, width of the upper portion and width of the base may vary substantially from this example. The height H1 may be from 2-10 microns, for example. The width W1 may be from 50-110 microns, for example. The width W2 is about 5% of the base width W1. The width W2 may vary from 5-11 microns, for example.

Figure 2:
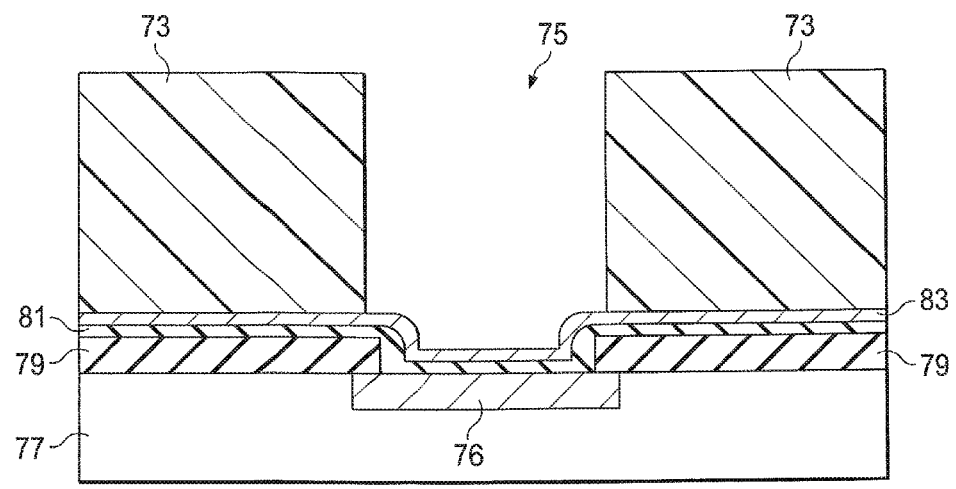
FIG. 2 depicts in a cross-sectional view an intermediate structure for forming a columnar pillar bump embodiment.

FIG. 2 illustrates in a cross sectional view an intermediate process step for forming the embodiment pillar of FIG. 1. In FIG. 2, photoresist 73 has been deposited, exposed, and developed, and forms an opening 75 over the semiconductor substrate 77. An integrated circuit may be formed in substrate 77. Terminal 76, which couples to circuitry formed within the integrated circuit (not shown) to form an electrical connection to the circuitry, is exposed by an opening in the passivation layer 79. Passivation layer 79 is a dielectric such as a polyimide, nitride, oxide or other material used for passivation. A barrier layer 81 is deposited over the substrate 77 (which may still be in wafer form at this stage of the process, or may be an individual die) and a seed layer 83 is sputtered or deposited over the barrier layer; together these layers form a UBM layer. The photoresist thus forms an opening that is a vertical column shape with selected portions of the upper surface of the seed layer 83 exposed. The seed layer for forming a copper pillar, which is the typical case, will also be copper or copper alloy and as such, will typically form a copper oxide ($CuO_2$) at the surface. Together the barrier layer 81 and the seed layer 83 form the UBM layer for the pillar. The UBM layer may have several functions. The layer 81 may provide a diffusion barrier and may also provide an adhesion layer, improving adhesion of subsequent layers. The seed layer 83 is used for the subsequent plating steps and also may act as an additional adhesion layer.

Figure 3:
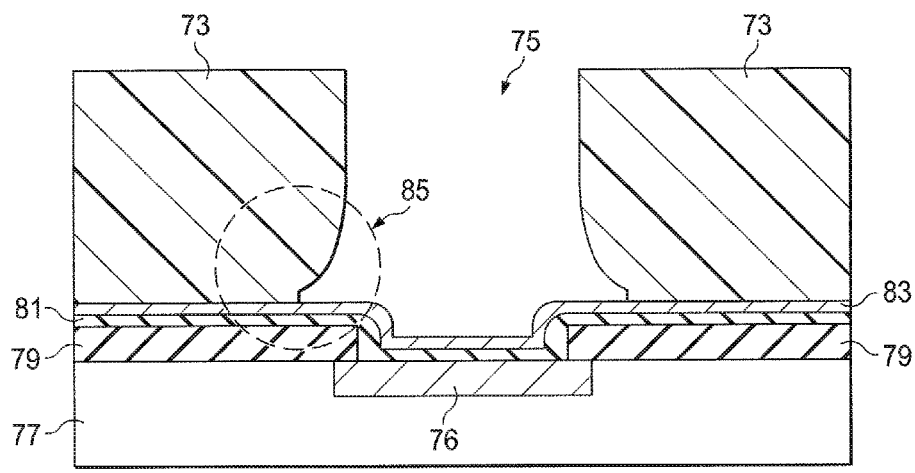
FIG. 3 depicts in a cross-sectional view the structure of FIG. 2 following additional processing steps.

FIG. 3 depicts the cross-section of FIG. 2 following additional processing steps of a method embodiment of the disclosure. In FIG. 3, the photoresist 73 has bird's beak openings such as in area 85 in the figure formed at the bottom of the opening 75, and at the top surface of the seed layer 83. The bird's beak openings form a base portion that is wider than the upper portion of the opening 75. When this opening is then filled by the copper pillar in subsequent ECP processes, the trapezoidal cross-section shape for the base portion of this embodiment pillar, such as shown in FIG. 1, will be obtained. Also, the UBM material that is covered by the wider base of the resulting pillar will be wider than the UBM of the prior art pillars as well, increasing the amount of UBM material that is retained beneath the copper pillar.

In a first method embodiment, the flared bottom portion of opening 75 in the PR layer 73 may be formed by an in situ method in a "pre-ECP" step. In a so-called "dry etch" process, a plasma treatment may be performed such as an $N_2$ $H_2$ plasma gas treatment using microwave or RF energy. Treating the upper surface of the exposed seed layer 83 at the bottom of the opening 75 to remove copper oxide ($CuO_2$) from the seed layer will also create, in the bottom corners of the opening 75, a bird's beak shape. This plasma treatment may be followed by an ECP process using a low initial deposition rate for the copper, (e.g., the initial deposition rate may be between 0.1-0.5 ASD. The units ASD are defined as current (amperes) per dm squared ($A/dm^2$)).

The use of a low initial deposition rate will cause a "gap filling" effect, enabling the plated copper pillar material to fill the bird's beak openings 85 of the photoresist opening 75 with the copper material, and may form a trapezoidal cross-section shape at the base portion.

In an alternative method embodiment, the flared bottom portion of opening 75 in the PR layer 73 may be formed in a "pre-ECP" in situ step that uses a wet clean process. In a wet process, a solution that removes copper oxide from the seed layer 83 at the bottom of the opening 75, or wet cleans that remove $CuO_2$ from the seed layer may be used. Alternative wet cleans such as dilute HF, piranha, and other cleans may be used. The wet etch chemistry is selected so that the bird's beak opening areas are formed in the photoresist. A low initial deposition rate ECP is then performed. As is known to those skilled in the art, a low initial deposition rate ECP will fill the bird's beak openings formed in the bottom corners by the wet etch or wet clean (areas 85 in FIG. 3). The bird's beak openings will be filled by the gap filling effect and the trapezoidal base portion of the copper pillar may be created. The wet process embodiment may be implemented by varying the chemistry used for the oxide cleaning steps to create the bird's beak patterns such as shown in area 85 in the PR layer 73. Following the gap filling ECP deposition, a normal deposition rate ECP process may then be used to form the remainder of the pillar.

In another method embodiment, a photoresist development step may be used to create the bird's beak areas 85 at the bottom of opening 75 during the photoresist processing. By using intentional defocusing and underexposure during the processing of the photoresist 73, the bird's beak shape at areas 85 in the opening can be created in the photoresist layer. This method embodiment has advantages in that it requires no additional mask steps and no additional chemical or plasma process steps, and is therefore very low in cost to implement in an existing pillar forming process. Following the creation of the bird's beak openings such as area 85 at the bottom of opening 75, a low initial deposition rate, gap filling ECP process may be used to cause the copper pillar material to fill the bird's beak extensions at the bottom of opening 75.

Figure 4:
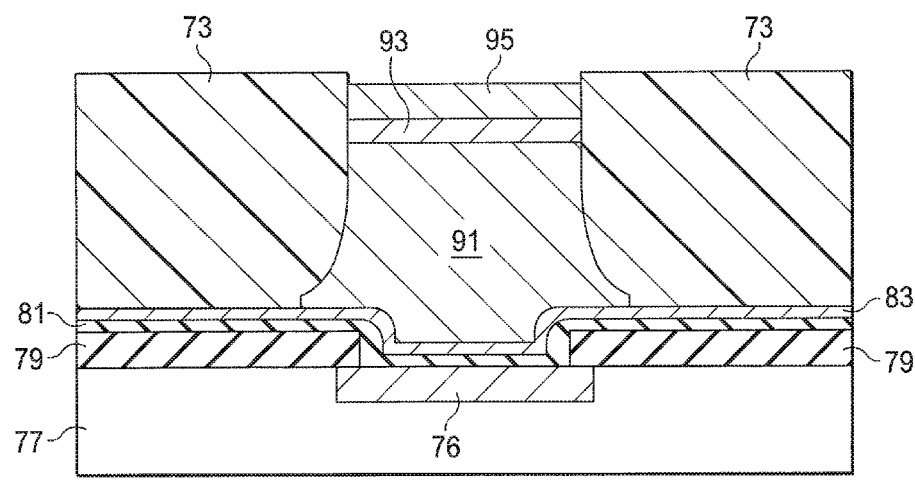
FIG. 4 depicts in a cross-sectional view the structure of FIG. 3 following additional processing steps.

FIG. 4 depicts the cross-section of FIG. 3 following additional processing steps. An ECP process is used to plate the copper pillar 91, which may be formed of copper and its alloys on the exposed surfaces of the seed layer 83, or other conductor metals and their alloys and combinations of these. A cap material such as nickel, palladium, platinum, gold or the like and alloys such as ENEPIG (electroless nickel, electroless palladium, immersion gold) or an alternative such as ENIG (electroless nickel, immersion gold) may be used over the copper pillar; this layer is optional and is not illustrated. A pre-solder layer 93 may be formed on the upper surface of the copper pillar 91. This layer may be formed by plating, sputtering, printing, or other PVD or CVD depositions. A solder layer 95 may then be formed; it may be plated by ECP, for example using the pre-solder as a seed layer. Other methods for forming the solder layer 95 may also be used. Layer 95 may be a lead based solder such as Pb or Pb/Sn, a lead free solder such as Sn, Sn/Ag, Sn/Ag/Cu, or other eutectic materials typically used as lead free solder.

Figure 5:
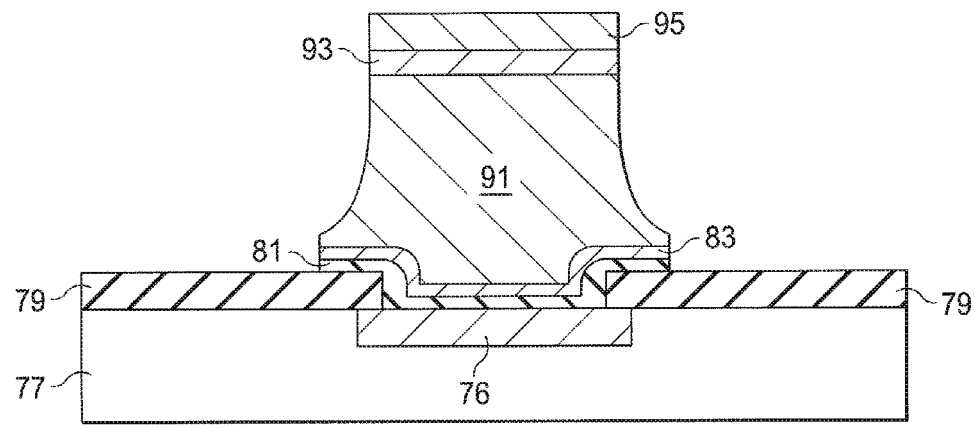
FIG. 5 depicts in a cross-sectional view the structure of FIG. 4 following additional processing steps.

FIG. 5 depicts the copper pillar bump 91 following still further processing. In transitioning from FIG. 4 to FIG. 5, the photoresist 73 is stripped, for example by ashing or other known PR strips, and the UBM layer including seed layer 83 and barrier layer 81 are selectively etched to remove the extra material from over the passivation layer 79. The finished pillar bump with pillar 91, pre-solder 93 and solder 95 may now be subjected to a thermal reflow step to form the pillar bump with a ball or bump shaped solder cap.

Figure 6:
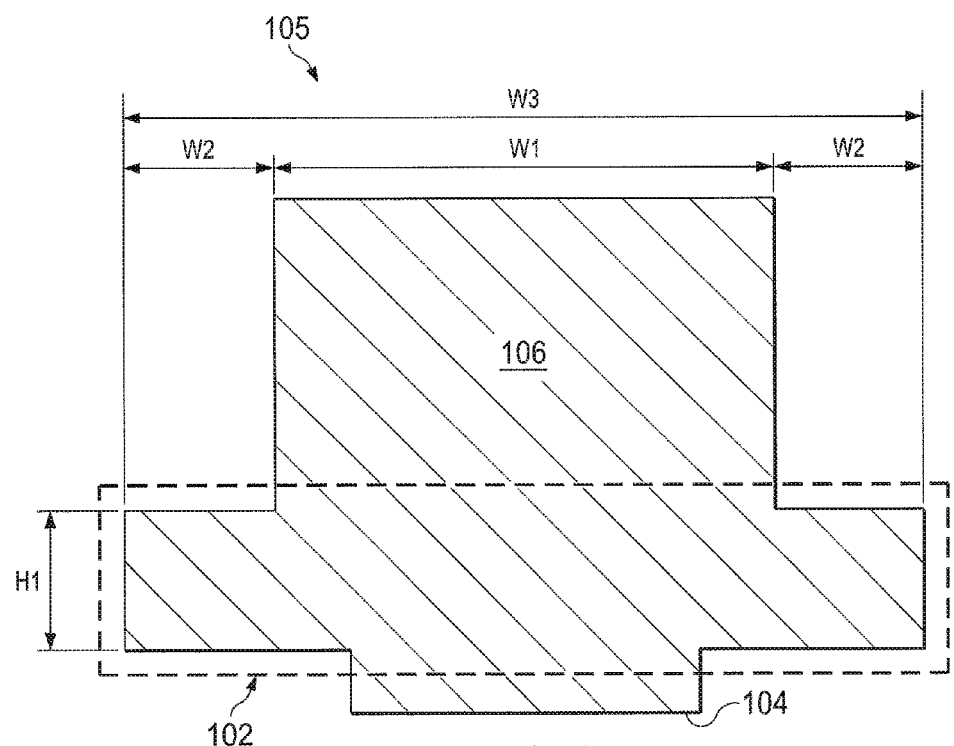
FIG. 6 depicts in a cross-sectional view an alternative embodiment columnar pillar bump.

FIG. 6 depicts in a cross-sectional view an additional embodiment shape for the columnar pillar bump. In FIG. 6, pillar 105 is widest at the base portion in the dashed rectangle numbered 102, with rectangular extensions of width W2 extending away from the central portion, while the upper portion 106 of pillar 105 has vertical sides extending to the top of the columnar pillar bump 105. Base portion 102 is wider than the top portion by approximately 10% or more or less, the base portion has rectangular extensions disposed opposing one another at each side that extend the width of the base portion. The rectangular bottom portion 104 extending downward from the base portion 102 is that part of the pillar that fills the opening made in the passivation layer (not shown) to contact the underlying terminal (also not shown). Thus, the base portion 102 overlies the passivation layer, the UBM material, and the bottom portion 104 which overlies and contacts the terminal. In one non limiting example, the pillar width W1 is approximately 85 microns. Each of the extended portions of the base 102 has a width W2 of approximately 5 microns, so that the width of the rectangular base W3 is approximately 95 microns in this example. The height H1 may be, for example, 3 microns. As described above in reference to FIG. 1, other heights and widths may be used as alternative embodiments, and these examples are illustrative and not limiting. The height H1 may be from 2-10 microns, for example. The width W1 may be from 50-110 microns, for example. The width W2 is about 5% of the base width W1. The width W2 may vary from 5-11 microns, for example.

The process for forming the columnar pillar 105 of FIG. 6 may be performed by a two step photoresist process. The two step photoresist process is performed by depositing a first PR layer and patterning the wider opening for the base portion first, then patterning a second photoresist layer forming an opening that defines the upper portion above it with a narrower width, to establish the overall pillar shape. Finally after the PR processes, the pillar is completed by plating using ECP processing. Because the height H1 of the base portion is sufficiently large, no "gap filing" or low initial deposition rate ECP plating step is needed. The ECP process will plate the base portion 102, and continue and form the upper portion 106 of pillar 105, as shown in FIG. 6.

Figures 7, 8:
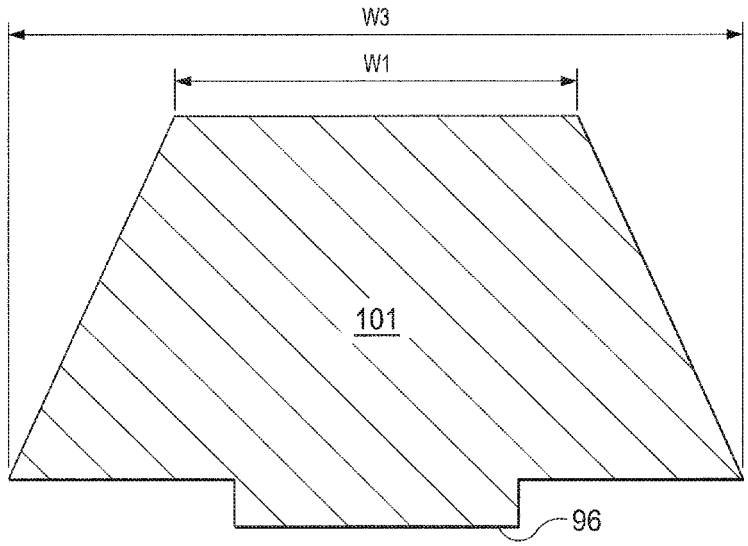
FIG. 7 depicts in a cross-sectional view another alternative embodiment columnar pillar bump.
FIG. 8 depicts a table presenting failure mode evaluations for a conventional pillar bump in comparison to the results obtained for pillar bumps of the embodiments.

FIG. 7 depicts in a cross-sectional view another alternative embodiment of the disclosure. In this alternative embodiment, a pillar 101 with a generally trapezoidal shape may be used. This embodiment is also wider at the base, and thus reduces thermal stress on various layers as compared to the columnar shape of the prior art. The pillar 101 has sloped sides extending with the slope running continuously from the widest portion at the bottom, and the upward surface of the sides slopes continuously to the top portion. In cross-section, the pillar 101 is a trapezoidal shape. The rectangular bottom portion 96 extending downwardly from the base is the portion of the pillar 101 that fills the opening in the passivation layer (not shown) to contact the underlying terminal (also not shown). In an illustrative and non-limiting example, the pillar 101 may have a width W1 that is approximately 85 µm wide at the top and a width W3 that is 95 µm wide at the bottom. Other arrangements that are wider at the base, and have the sloping sides as shown in FIG. 7, are also alternatives contemplated as embodiments. For any of the embodiments of this disclosure, the size of the pillar may be varied and scaled with process sizes. Width W1 may vary from 50-110 microns, for example. The width W3 is about 110-130% of the base width W1 and thus may vary from 55-130 microns, for example.

The embodiment pillar 101 of FIG. 7 may be formed during the photoresist processing using photolithographic defocus and exposure energy variations. The sloping sides extend from the widest portion near the bottom up to the top of the pillar 101. This slope is accomplished by intentional defocus and by varying the exposure energy during the photoresist processing. The exposure and development steps are followed by the plating of the pillar using ECP as before, and the pillar shape is then determined by the shape of the opening in the PR.

The embodiments of FIGS. 6 and 7 may be formed without the use of electroplating, for example electro-less and seedless depositions of the pillars may be used. There is no need for the gap filling effect of a low initial deposition rate process in these embodiments, as they do not include the bird's beak patterns of the embodiment of FIG. 1, for example.

FIG. 8 presents in a table format the results of evaluations of normalized stress for pillars made using the conventional approach using columnar pillars, and, comparing each of the embodiments described above. The normalized stress identified for many pillars formed on test devices were categorized and evaluated for significance. The delamination of the extreme low K (ELK) materials was identified as the most frequent and therefore most significant failure mode. Other failures modes were also identified, including delamination in the UBM, passivation, solder bump (BUMP in the table), pre-solder, and underfill (UF) layers. The temperature conditions for the evaluations are also shown in the table, either following reflow at 25 degrees Celsius or after thermal cycle tests (TCT) at a maximum test (125 degrees C.) or minimum test (−55 degrees C.) temperature.

In preparing the table entries, the stress evaluation was normalized for each category so that the stress for the conventional pillar bumps is set to 1.00. Any number in the table that is lower than 1.00 for a category of stress represents an improvement over the prior art approach.

In the first row of the table in FIG. 8, the most important failure mode, ELK delamination, is shown for pillars shaped using the prior approach and for each of the embodiments. The embodiment of FIG. 1, with the trapezoidally shaped base, has a value of 0.91 for the ELK failure mode. This is an improvement over the conventional pillar. Similarly, the rectangular base pillar of FIG. 6 also has an improvement in the ELK delamination failure mode. The last column is the embodiment of FIG. 7 with the sloping sides and the wide base. It also has an improved failure rate for the ELK delamination.

The embodiments also show improvement for most of the other categories of stress over the conventional pillars. For some stress point of interest, the embodiments might exceed 1.00, but for the weakest failure points, ELK delamination and UBM delamination, the embodiments are clearly improved over the conventional pillar bumps.

Each of these embodiments has a cross-section with sides that are not vertical from the bottom of the columnar pillar to the top. Instead, each has a base portion that is a wider width than the top, with the sides either sloping at least for a portion, or with the sides forming a horizontal extension extending outwardly at the base from the remaining vertical portion. The wider base portion overlies the UBM layers, and because in each of the embodiments the base portion is larger than the base of the conventional pillar, the UBM layer that remains underneath the pillar after processing is also larger in area than the UBM layers of the prior art pillars, which improves thermal performance. The use of the pillars of the embodiments provides relief from thermal stress effects that occur with the prior art pillars.

The use of the illustrative embodiments reduces thermal stress on various layers in the assembled integrated circuit. Experiments using the known "white bump" test have shown that in a row of copper pillar bumps using the pillar shape of the embodiments, no failures in the bumps were detected, while pillars formed using the conventional pillar shape approach exhibited many thermal stress failures when formed on the same test wafer and subjected to the same conditions.

The wider base portions of some of the embodiments also provide a wider UBM portion than would otherwise be used, which further reduces thermal stress effects. Stress in simulations was shown to be lowered for the ELK layer, the passivation layer, the UBM layer, the bumps, and the UF material in assembled integrated circuits using the embodiments of the disclosure.

In an embodiment, an apparatus comprises a semiconductor substrate having at least one input/output terminal on a surface thereon; a pillar disposed over the at least one input/output terminal, comprising: a bottom portion contacting the input/output terminal; an upper portion having a first width; and a base portion over the bottom portion having a second width greater than the first width.

In another embodiment, a method comprises forming input/output terminals for external connectors on one surface of a semiconductor substrate; depositing a passivation layer over the input/output terminals; patterning the passivation layer to form openings exposing a portion of the input/output terminals; depositing a seed layer over the passivation layer; depositing a photoresist layer over the seed layer; developing the photoresist layer to form photoresist openings in the photoresist layer over the input/output terminals; patterning the bottom portion of the photoresist openings to form bird's beak patterns at the bottom of the openings, the bird's beak patterns extending outwardly from the openings; and plating a conductive material to fill the photoresist openings; wherein the conductive material forms a pillar extending upwardly from the seed layer having an upper portion with a first width and a base portion with a second width that is greater than the first width.

In another embodiment a method comprises forming input/output terminals for external connectors on one surface of a semiconductor substrate; depositing a passivation layer over the input/output terminals; patterning the passivation layer to form openings exposing a portion of the input/output terminals; depositing a seed layer over the passivation layer; depositing a photoresist layer over the seed layer; developing the photoresist layer to form photoresist openings in the photoresist layer over the input/output terminals defining a base portion and an upper portion; and plating a conductive material to fill the photoresist openings; wherein the conductive material forms a pillar extending upwardly from the seed layer having an upper portion with a first width and a base portion overlying the passivation layer with a wider second width.

Although embodiments of the present disclosure have been described in detail, it should be understood that various changes, substitutions and alterations can be made herein without departing from the spirit and scope of the disclosure as defined by the appended claims. For example, it will be readily understood by those skilled in the art that the methods used to form the embodiments may be varied while remaining within the scope of the present disclosure.

Moreover, the scope of the present application is not intended to be limited to the particular embodiments of the methods and steps described in the specification. As one of ordinary skill in the art will readily appreciate from the disclosure of the present disclosure, processes or steps, presently existing or later to be developed, that perform substantially the same function or achieve substantially the same result as the corresponding embodiments described herein may be utilized according to the present disclosure. Accordingly, the appended claims are intended to include within their scope such processes or steps.

What is claimed is:

1. An apparatus, comprising:
    a semiconductor substrate having at least one input/output terminal on a surface thereon, the input/output terminal having a terminal width;
    a passivation layer overlying the semiconductor substrate and the at least one input/output terminal thereon;
    an opening in the passivation layer exposing a portion of an upper surface of the at least one input/output terminal;
    a pillar disposed over the at least one input/output terminal comprising:
        a bottom portion comprising an under-bump metallization layer having a bottom width less than or equal to the terminal width, the bottom portion overlying the passivation layer and extending into the opening and contacting the input/output terminal;
        an upper portion having a first width; and
        a base portion disposed on the bottom portion having a second width greater than the first width, wherein the second width is greater than the bottom width and the terminal width, and the upper portion is disposed on an upper part of the base portion.

2. The apparatus of claim 1, wherein the base portion has a shape, in cross-section, which is a trapezoidal shape.

3. The apparatus of claim 1, further comprising an under bump metallization layer further comprises a seed layer and a barrier layer.

4. The apparatus of claim 3, wherein the seed layer comprises copper.

5. The apparatus of claim 3, wherein the barrier layer comprises titanium.

6. The apparatus of claim 1, wherein the pillar comprises copper.

7. The apparatus of claim 1, further comprising a solder layer disposed over the pillar.

8. The apparatus of claim 1, further comprising a passivation layer disposed over the surface of the substrate, wherein the bottom portion of the pillar extends into an opening in the passivation layer exposing the input/output terminal, and the base portion of the pillar overlies the passivation layer outside of the opening exposing the input/output terminal and also overlies the bottom portion.

9. The apparatus of claim 1, wherein the pillar further comprises the upper portion having vertical sides and disposed over the base portion, the base portion having sides with non vertical portions further comprising sloping sides that extend from the bottom of the base portion and that intersect the vertical sides of the upper portion at an angle greater than 90 degrees.

10. The apparatus of claim 1, wherein the base portion further comprises rectangular extensions that extend outwardly from the center of the base portion, and the upper portion has vertical sides.

* * * * *